United States Patent [19]
Nishimura

[11] Patent Number: 6,016,266
[45] Date of Patent: Jan. 18, 2000

[54] SEMICONDUCTOR DEVICE WITH A FERROELECTRIC CAPACITOR

[75] Inventor: Kiyoshi Nishimura, Kyoto, Japan

[73] Assignee: Rohm Co., Ltd., Kyoto, Japan

[21] Appl. No.: 08/986,536

[22] Filed: Dec. 8, 1997

[30] Foreign Application Priority Data

Dec. 9, 1996 [JP] Japan .................................. 8-328092

[51] Int. Cl.$^7$ .................................................. G11C 11/22
[52] U.S. Cl. .............................. 365/145; 365/149; 365/65
[58] Field of Search .................................. 365/145, 149, 365/65

[56] References Cited

U.S. PATENT DOCUMENTS

| | | | |
|---|---|---|---|
| 5,508,954 | 4/1996 | Mihara et al. | 365/145 |
| 5,530,668 | 6/1996 | Chern et al. | 365/145 |
| 5,546,342 | 8/1996 | Nakane et al. | 365/189.01 |
| 5,726,930 | 3/1998 | Hasegawa et al. | 365/145 |
| 5,754,466 | 5/1998 | Arase | 365/145 |

*Primary Examiner*—David Nelms
*Assistant Examiner*—Tuan T. Nguyen
*Attorney, Agent, or Firm*—Merchant & Gould P.C.

[57] ABSTRACT

An object of the present invention is to provide a semiconductor device having a ferroelectric capacitor wherein the ferroelectric capacitor is difficult to get bad electric property. In a capacitor unit CbU for load, a bridge circuit is made including a ferroelectric capacitor Cb for load, transistors Q1, Q2, Q3 and Q4. The both ends of the bridge circuit is connected with a bit line /BL1 and the ground G, respectively. A line SWS is connected with the gates of both transistors Q1 and Q3 and further is connected with the gate of both transistors Q2 and Q4 via an inverter 104. A switch-signal generating circuit 102 shifts the level of switch signal for the line SWS whenever the number of leading edges of the line GCP reaches a predetermined number. According the shifted switch signal, the direction of the capacitor Cb for load in its bridge circuit is changed. That can prevent the capacitor Cb for load from getting a bad electric property.

20 Claims, 10 Drawing Sheets

SEMICONDUCTOR DEVICE WITH A FERROELECTRIC CAPACITOR

Cross-Reference to Related Application

The entire disclosure of Japanese Patent Application No. Hei 8-328092 filed on Dec. 9, 1996 including specification, claims, drawings and summary are incorporated herein by reference in its entirety.

BACKGROUND OF THE INVENTION

1. Field of the invention

This invention relates to a semiconductor device, more particularly, a semiconductor device having a ferroelectric capacitor.

2. Description of the Earlier Technology

Ferroelectric memories formed by ferroelectric capacitors are known as nonvolatile semiconductor memories. FIG. 10 shows a part of a ferroelectric memory including a memory cell 11 in a circuit diagram. The memory cell 11 comprises a ferroelectric storage capacitor C11. One end of the ferroelectric capacitor C11 is electrically connected in series with a ferroelectric capacitor Cb for load via a selector transistor TR11 and a bit line /BL1.

The bit line /BL1 is connected to one end of a sense amplifier AMP1, the other end of which is connected to a reference-cell preset circuit portion RC via a bit line BL1.

In the reference-cell preset circuit portion RC, one end of a reference ferroelectric capacitor Cr is electrically connected with a ferroelectric capacitor Cc for load via a transistor TRC and the bit line BL1.

To read data out of the memory cell M11, after electricity is discharged from the capacitor Cb for load, a read-out voltage is applied to the both ends of a section in which the ferroelectric capacitor C11 and the capacitor Cb for load are connected in series. Then, a potential Vt occurs in the bit line /BL1 according to a polarity state (or data) of the ferroelectric capacitor C11.

After electricity is discharged from the capacitor Cc for load a voltage for generating a threshold voltage is applied to both ends of a section in which the ferroelectric capacitor Cr and the capacitor Cc for load are connected in series. Then, a predetermined voltage Vref occurs in the bit line BL1.

A sense amplifier AMP1 makes a comparison of value between the reference voltage Vref and the above-mentioned potential Vt and thereby can know data.

As described above, in addition to the ferroelectric capacitor C11, the capacitors Cb and Cc and the reference capacitor Cr are all made using ferroelectric. That enables all capacitors which is necessary to obtain both the reference voltage Vref and the potential Vt to be made at the same manufacturing step. This manufacturing technology can decrease variation of electric property for each of the capacitors due to difference between manufacturing steps. That is, it can prevent the reference voltage Vref and the potential Vt from changing according to differences between manufacturing steps.

There are, however, the following problems in the described-above ferroelectric memory. Since the ferroelectric storage capacitor C11 is to have remanence of different directions for the kinds of data, the direction of remanence is shifted when data is rewritten into the ferroelectric capacitor C11. Therefore, the ferroelectric capacitor has relative difficulties in getting a bad electric property (which is called as "imprint effect") due to the remanence.

In the capacitor Cb or Cc for load or the reference capacitor Cr, however, a voltage of the same direction (or polarity) is applied thereto when data is written into the ferroelectric capacitor C11. Therefore, these capacitors always have remanence of the same direction even though data is rewritten into the ferroelectric capacitor C11. That leads to a bad electric property due to the remanence of ferroelectric in long time periods. On getting the bad electric property, distortion occurs in each of the hysteresis loops of these capacitors (see FIG. 9).

When distortion occurs in the hysteresis loop of the capacitor Cb for load, the described-above potential Vt changes. Also, when distortion occurs in the hysteresis loop of the capacitor Cc for load or the reference ferroelectric capacitor Cr, the described-above reference voltage changes. In this case, data can not be read out correctly. That is, as time passes the reliability in reading data out of the memory cell decreases.

SUMMARY OF THE INVENTION

An object of this invention is to provide a semiconductor device including a ferroelectric capacitor which has difficulties in getting a bad electric property as well as to solve such a problem.

A semiconductor device according to this invention comprises:

a pair of sections to which their respective voltages is applied, the polarity between the pair of sections being not shifted, and, a ferroelectric capacitor which is electrically connected with the pair of sections, wherein the semiconductor device is designed to be able to substantially change the direction in which the ferroelectric capacitor is connected with the pair of sections.

Though the features of this invention has been shown widely as described above, the features, objects and aspects of the present invention will become more apparent from the detail description of the present invention when taken in conjunction with the accompanying drawings.

DESCRIPTION OF THE PREFERRED EMBODIMENT

Figure 1:
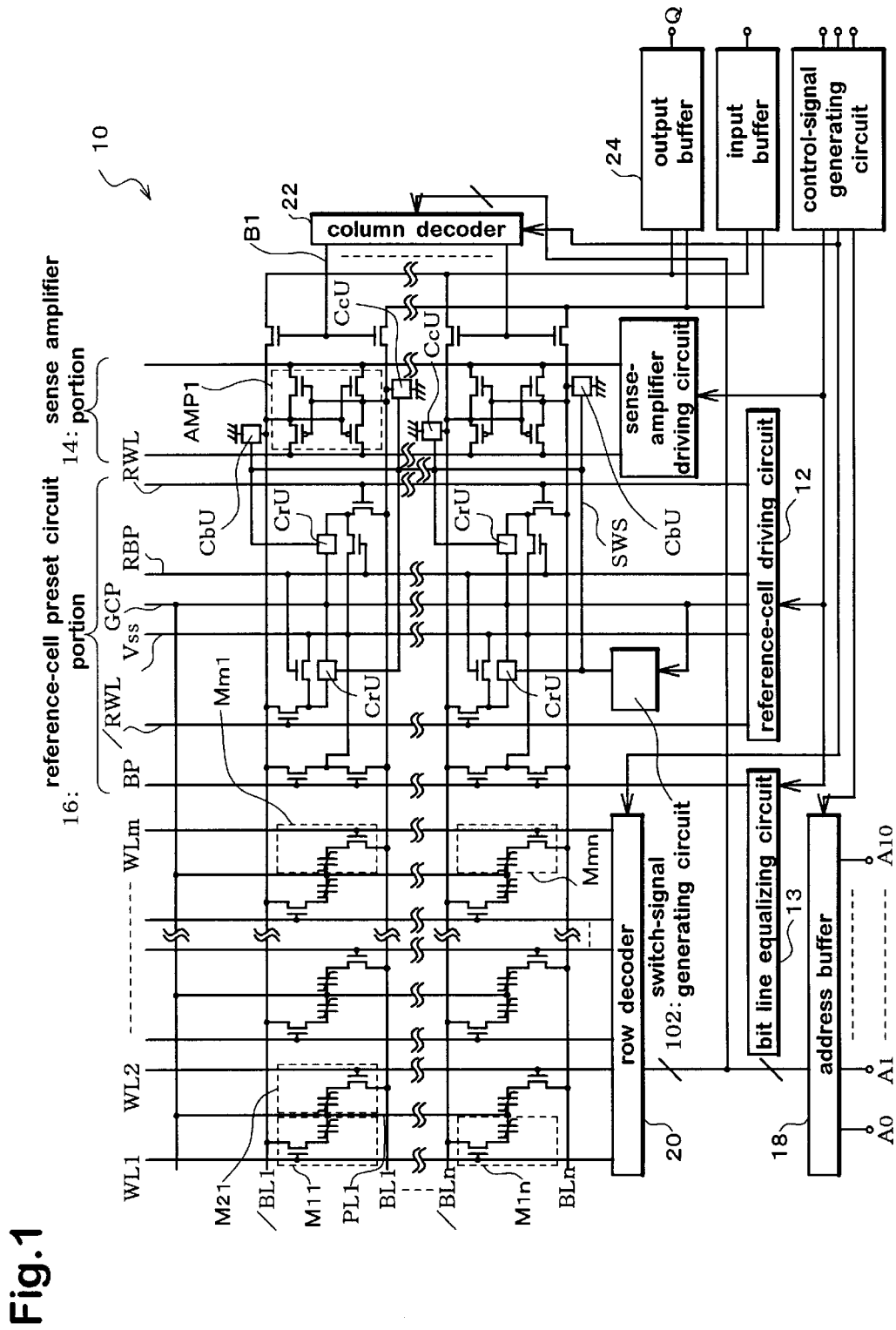
FIG. 1 is a circuit diagram showing a part of a ferroelectric memory 10 which is a semiconductor device comprising a ferroelectric capacitor according to an embodiment of the present invention.

FIG. 1 shows a part of a ferroelectric memory 10 which is a semiconductor devices comprising a ferroelectric capacitor according to an embodiment of the present invention in a circuit diagram. The ferroelectric memory 10 has a matrix structure composed of plural memory cells M11, M21, . . . , Mmn. Note that in FIG. 1 a longitudinal line in which a series of memory cells (M11, . . . , M1n) stand is referred to as a "row" while a horizontal line in which a series of memory cells (M11, . . . , Mm1) stand is referred to as "column".

The ferroelectric memory further comprises, a reference-cell driving circuit 12, a sense amplifier portion 14 having sense amplifiers AMP1 . . . and a reference-cell preset circuit portion 16. The reference-cell driving circuit 12 is used to apply a read-out voltage to a plate line PL1 via a global cell plate line (hereinafter, referred to as the "line GCP"). The sense amplifier portion 14 and the reference-cell preset circuit 16 are used to read out data. Also, the reference-cell driving circuit 12 and the sense amplifier portion 14 are used to rewrite data as described later.

Also, there is provided a switch-signal generating circuit 102 which is used to generate a switch signal on the basis of signal from the line GCP described later. The switch signal is given to both the mentioned-later capacitor units CbU and CcU for load and the reference capacitor unit CrU via a line SWS.

In this embodiment, it should be noted that the reference-cell driving circuit 12 is to be used both to apply the read-out voltage and to rewrite data while the sense amplifier portion 14 is to be used both to read out data and to rewrite data. Such a configuration leads to simplification in circuit.

Figure 2:
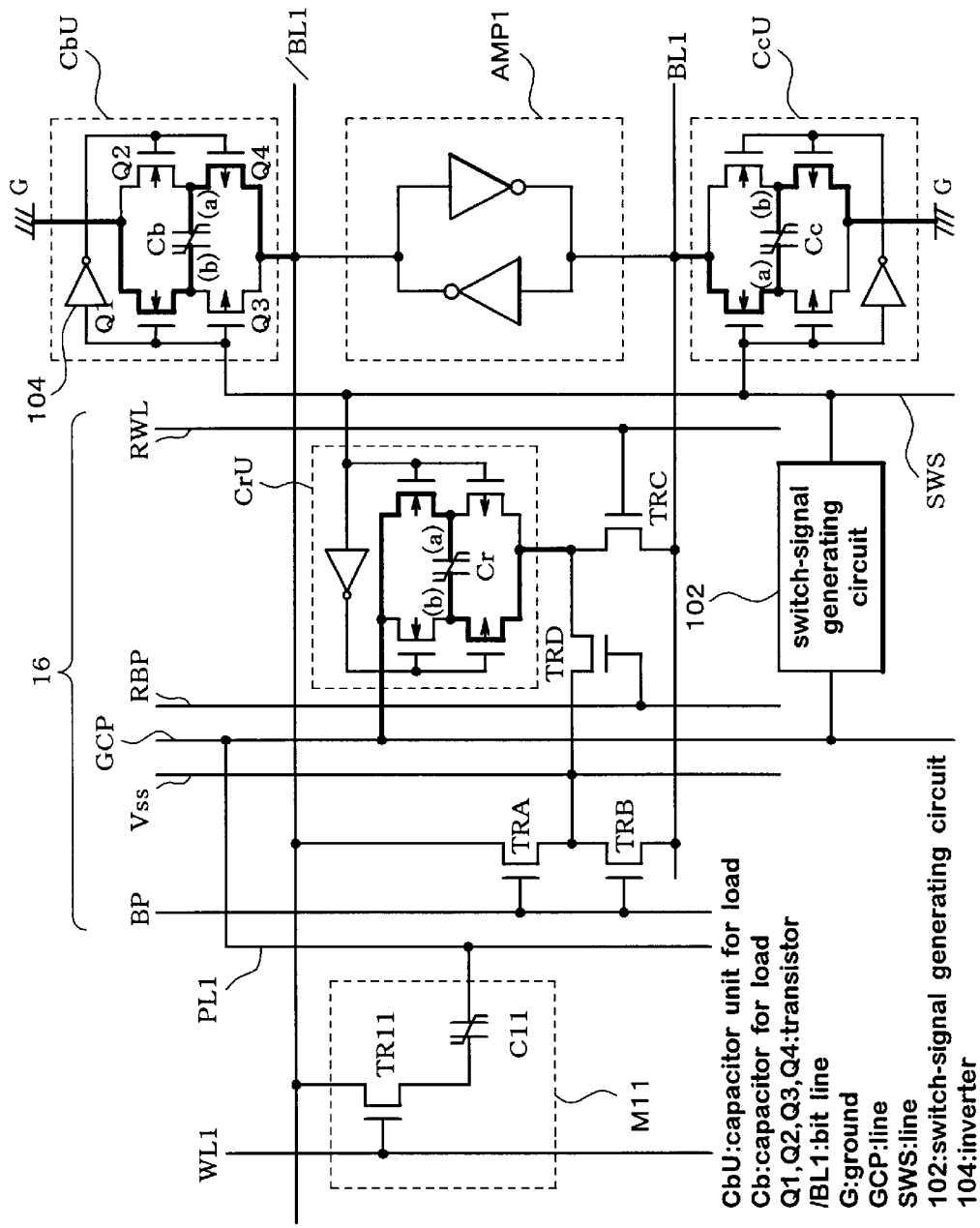
FIG. 2 is a close-up circuit diagram showing a part of the ferroelectric memory 10 of FIG. 1.

FIG. 2 shows the memory cell M11 and its vicinity in a circuit diagram in close-up. The memory cell M11 comprises a ferroelectric storage capacitor C11 which is a storage capacitor and a selector transistor TR11. One end of the storage ferroelectric capacitor C11 is connected with the capacitor unit CbU for load via the selector transistor TR11 and the bit line /BL1.

In the capacitor unit CbU for load, a bridge circuit is made including a capacitor Cb for load which is used as a ferroelectric capacitor for load, transistors Q1 and Q2 which are both an N-channel MOSFET and transistors Q3 and Q4 which are both a P-channel MOSFET. Both ends of the bridge circuit are connected to the bit line /BL1 and the ground G, respectively.

The described-above line SWS is connected with the gates of the transistors Q1 and Q3. Further, the line SWS is connected with the gates of the transistors Q2 and Q4 via an inverter 104. The direction in which the capacitor Cb for load is connected with the ends of the bridge circuit is changed with a switch signal from the line SWS.

Figure 3A:
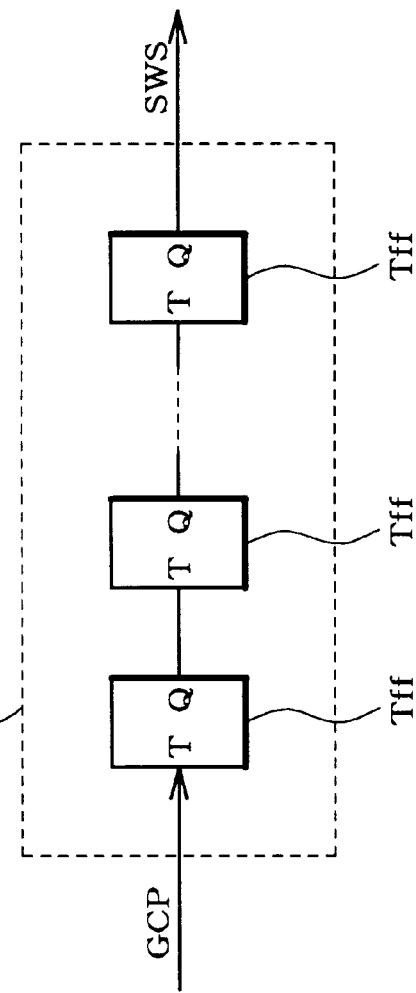
FIG. 3A is a schematic diagram showing one example of a construction of a switch-signal generating circuit 102.
Figure 3B:
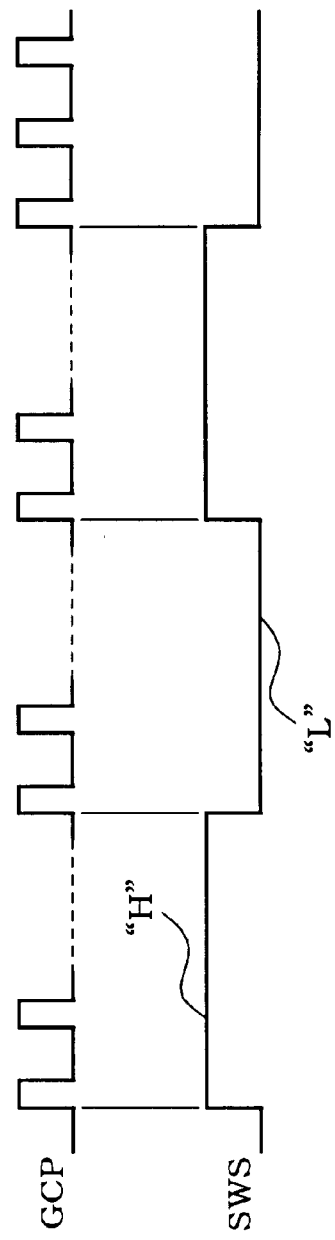
FIG. 3B is a timing chart showing the relationship between leading edges of the line GCP and the switch signal for the line SWS.

FIG. 3A shows one example of construction of switch-signal generating circuit 102 in a schematic diagram. The switch-signal generating circuit 102 serves as a counter which consists of plural T flip-flop circuits Tff connected in series. As shown in FIG. 3B, the switch-signal generating circuit 102 shifts the level of switch signal which is being output to the line SWS whenever leading edges of the line GCP are counted to be a predetermined number.

For example, when the switch signal in the line SWS is in a high state "H" the transistors Q1 and Q4 of FIG. 2 are on and the transistors Q2 and Q3 of FIG. 2 are off. This means that a side (a) of the capacitor Cb for load is connected to the bit line /BL1 while a side (b) of the capacitor Cb for load is connected to the ground G (FIG. 2 shows a continuity state (a state shown in the thick line) when the switch signal in the line SWS is in the high state "H").

On the other hand, when the switch signal in the line SWS is in a low state "L" the transistors Q1 and Q4 are off and the transistors Q2 and Q3 are on. This means that the side (a) of the capacitor Cb for load is connected to the ground G while the side (b) of the capacitor Cb for load is connected to the bit line /BL1.

Note that the following description is in a case where the switch signal in the line SWS is in the high state "H" except when notice is given.

The other end of the ferroelectric capacitor C11 is connected to the reference-cell driving circuit 12 (see FIG. 1) via the plate line PL1 and the line GCP.

The gate of the selector transistor TR11 is connected to the word line WL1. To the bit line /BL1 is connected one end of the sense amplifier AMP1, the other end of which is connected to the reference-cell preset circuit 16 via the bit line BL1.

In the reference-cell preset circuit 16, one end of the reference capacitor unit CrU is connected to the capacitor unit CcU for load via the transistor TRC and the bit line BL1. Also, the one end of the reference capacitor unit CrU is connected to the grounding line Vss via the transistor TRD. The other end of the reference capacitor unit CrU is connected to the reference-cell driving circuit 12 (see FIG. 1) via the line GCP.

In the reference capacitor unit CrU, a bridge circuit including a ferroelectric capacitor Cr which is used as a reference ferroelectric capacitor is made, which has the same structure as the described-above capacitor unit CbU for load. The direction of the ferroelectric capacitor Cr in the bridge circuit is switched with the switch signal from the line SWS. In the state of FIG. 2, a side (a) of the ferroelectric capacitor Cr is connected to the line GCP and a side (b) is connected to both the transistor TRC and the transistor TRD.

In the capacitor unit CcU for load, a bridge circuit including a capacitor Cc for load which is used as a ferroelectric capacitor for load is made, which has the same structure as the capacitor unit Cb for load. The direction of the capacitor Cc for load in the bridge circuit is switched with the switch signal from the line SWS. In the state of FIG. 2, a side (a) of the capacitor Cc for load is connected to the bit line BL1 and a side (b) is connected to the ground G.

The gate of the transistor TRC is connected to the reference-cell driving circuit 12 (see FIG. 1) via the line RWL. The gate of the transistor TRD is connected to the reference-cell driving circuit 12 (see FIG. 1) via the line RBP.

The bit lines /BL1 and BL1 are connected to the grounding line Vss via the transistors TRA and TRB, respectively. The gates of transistors TRA and TRB are both connected to abit-line equalizing circuit 13 (see FIG. 1) via the line BP.

Figure 4:
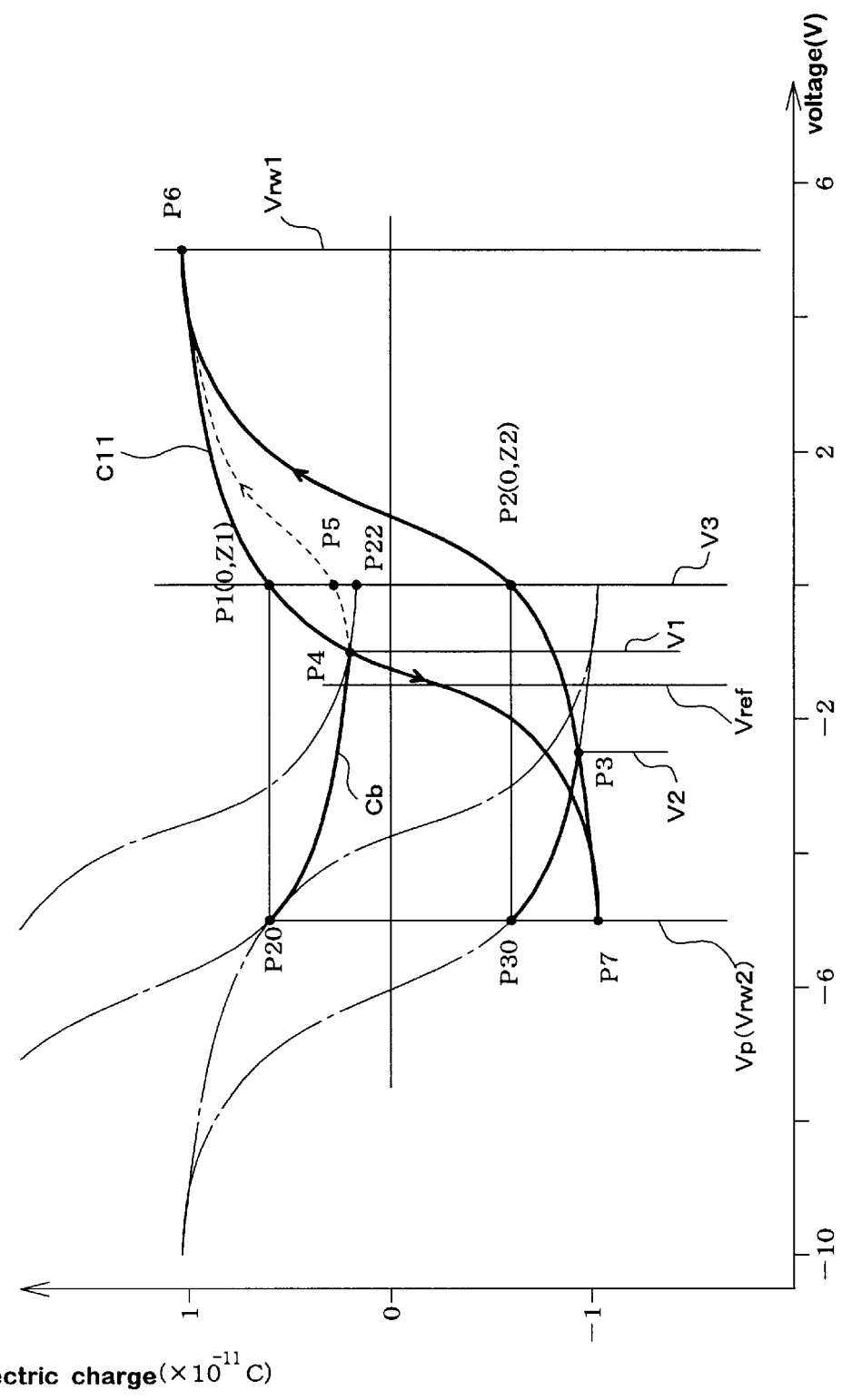
FIG. 4 is a graph showing a hysteresis curve which is used to explain operations of the storage ferroelectric capacitor in the ferroelectric memory 10.

FIG. 4 is a hysteresis curve showing the relationship between voltage and polarity state in the ferroelectric capacitor C11, wherein the voltage means a potential of the bit line /BL1 when voltage of the plate line PL1 shown FIG. 2 is used as a reference potential and a quantity of electric charge is used as the polarity state. In FIG. 4, a first polarity state P1 means a state wherein the capacitor C11 has remanence Z1 and a second polarity state P2 means a state wherein the capacitor C11 has remanence Z2, the remanence Z1 corresponding to data "H" and the remanence Z2 corresponding data "L".

In this embodiment, the absolute value of the described-later first rewrite voltage Vrw1 is designed to be equal with the absolute value of the described-later readout voltage Vp.

Figure 5:
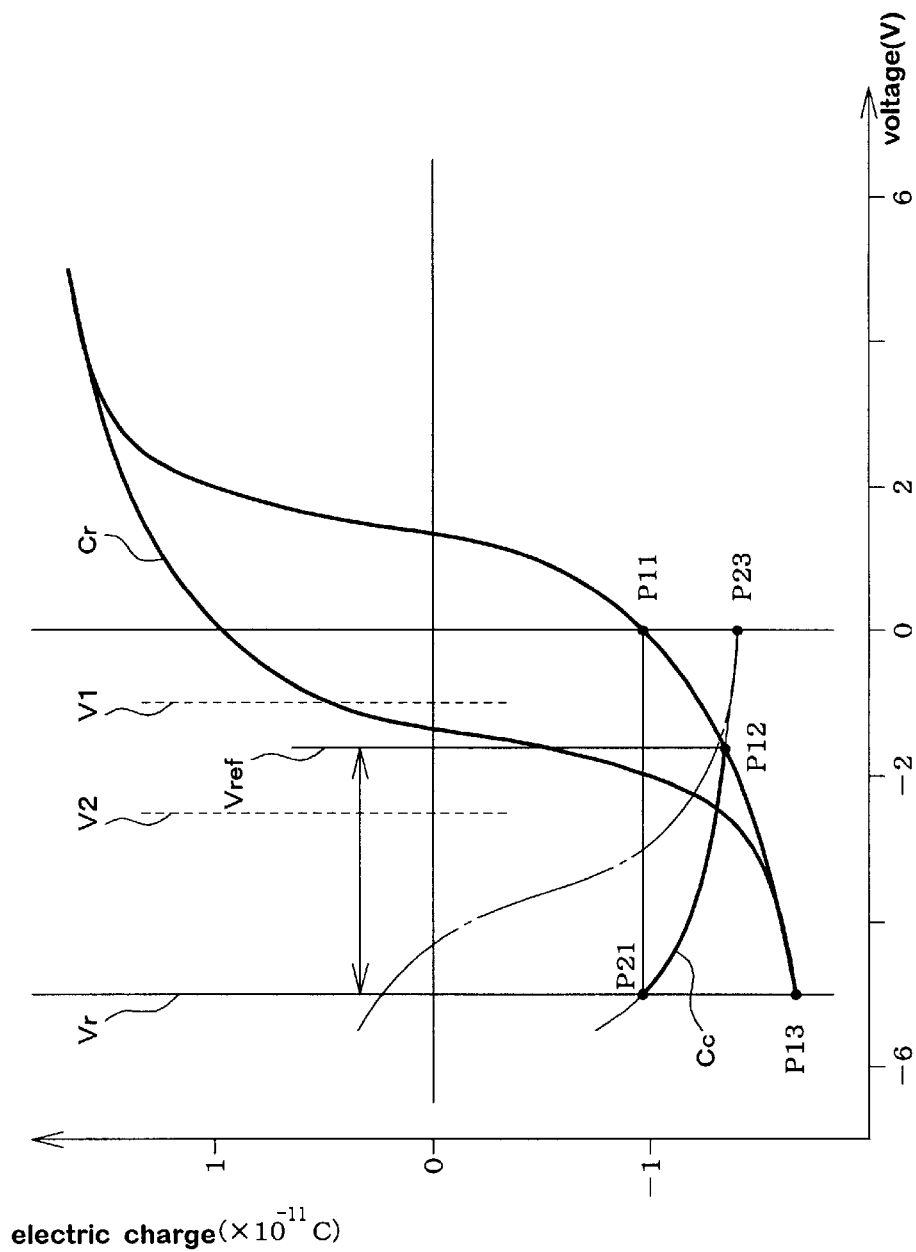
FIG. 5 is a graph showing a hysteresis curve which is used to explain operations of the reference ferroelectric capacitor in the ferroelectric memory 10.

FIG. 5 is a hysteresis curve showing the relationship between voltage and polarity state about the ferroelectric capacitor Cr, wherein the voltage means a potential of the bit line BL1 when the voltage of the line GCP shown FIG. 2 is used as a reference potential and a quantity of electric charge is used as the polarity state.

In this embodiment, the ferroelectric capacitor Cr, the capacitor Cc for load, the described-above ferroelectric capacitor C11 (see FIG. 4) and the capacitor Cb for load, which are all provided on the same substrate, are ferroelectric capacitors which are formed simultaneously at the same manufacturing step. Therefore, even when large differences occurs between manufacturing steps, the differences due to manufacturing steps do not make a variation for the electric property of these capacitors. That fact is one of the advantages in the present invention.

In this embodiment the ferroelectric capacitor C11, the capacitor Cb for load and the capacitor Cc for load are designed to show the same hysteresis curve (or the relationship betweenthevoltage and the electric charge). Therefore, these three capacitors always have a certain electric property, which leads to a great increase in reliability of operations.

As shown in FIG. 5, the hysteresis curve of the ferroelectric capacitor Cr is different from the hysteresis curve of the capacitor Cc for load. The reference potential Vref can be set by using the two different hysteresis curves.

Next, there will be described operations when data is read out of the ferroelectric memory 10. When, for example, data is read out of the memory cell M11, the corresponding address is given to an address buffer 18 shown in FIG. 1, thereby selecting the memory cell 11 with a row decoder 20 which is used to select a row and a column decoder 22 which is used to select a column.

Figure 6:
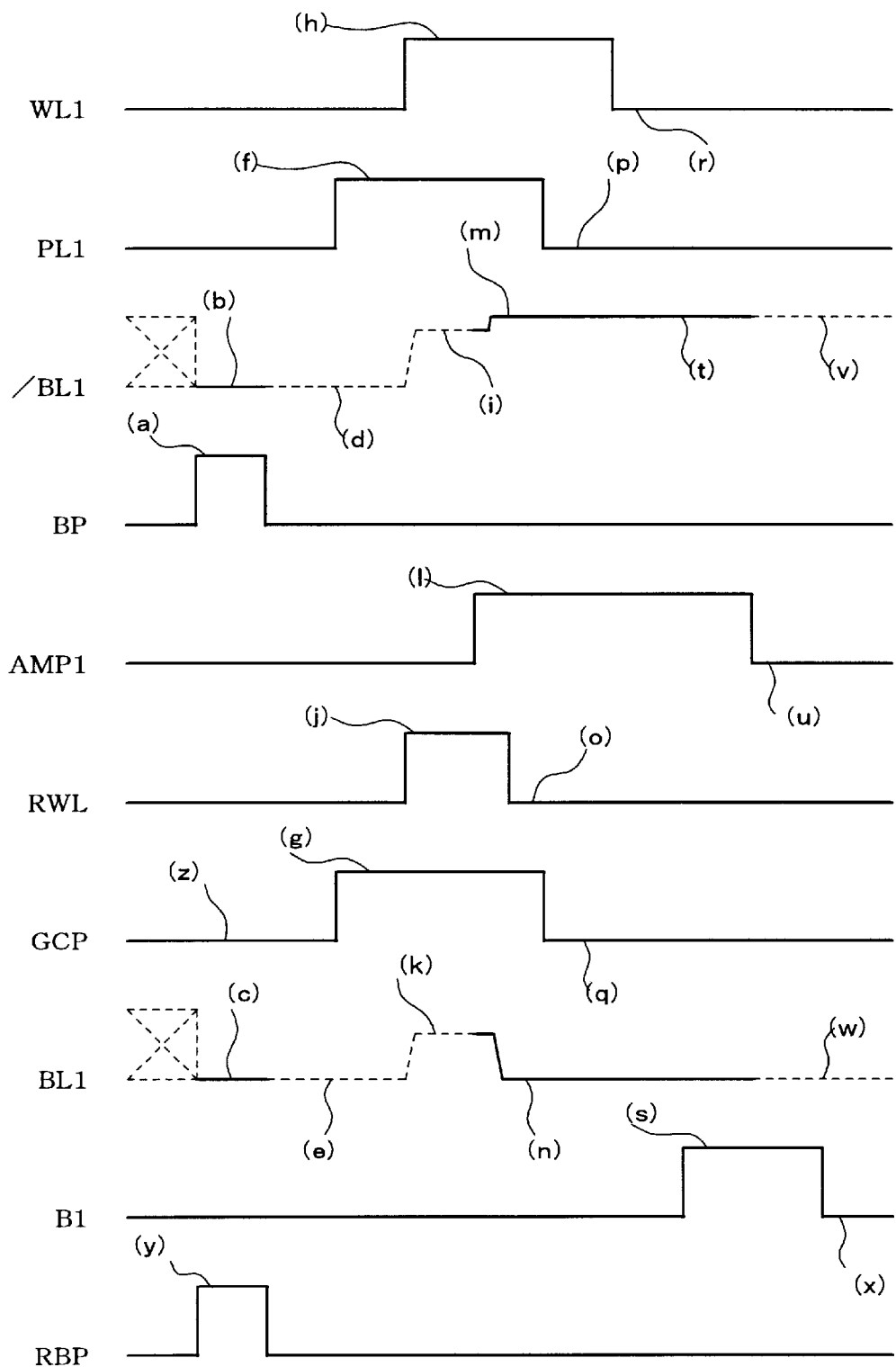
FIG. 6 is a timing chart which is used to explain operations for reading out data "H" in the ferroelectric memory 10.

FIG. 6 is a timing chart showing the state of each signal line or the like when data "H" is read out. When the data "H" is held, the ferroelectric capacitor C11 is in a polarity state of P1 in FIG. 4. Referring to FIG. 1 and FIG. 6, there will be described operations when the data "H" is read out with reference to FIG. 2, FIG. 4 and FIG. 5.

First, the bit-line equalizing circuit 13 (see FIG. 1) switches the line BP to a high state "H" for a fixed time and then switches back it to a low state "L" (see FIG. 6(a)). As a result of that, the transistors TRA and TRB (see FIG. 2) switch on for the fixed time. For that time the grounding line Vss is connected with both the bit line /BL1 and the bit line BL1, thereby getting the bit lines /BL1 and BL1 into the low state (see FIG. 6(b) and (c)).

By getting the bit lines /BL1 and BL1 into the low state "L" for the fixed time, electricity is discharged from the capacitors Cb and Cc. This discharge forces the capacitor Cb into a polarity state P20 in FIG. 20. Similarly, the capacitor Cc for load is forced into a polarity state P21 in FIG. 5.

After that, the transistors TRA and TRB turn off, thereby getting the bit lines /BL1 and BL1 into a state of floating (FIG. 6(d) and (e)).

After the line RBP is switched to a high state "H" for the fixed time using the reference-cell driving circuit 12 (see FIG. 1) as the line BP is switched to a high state "H" for fixed time, the line RBP is switches back to a low state "L" (FIG. 6(y)). As a result of that, the transistor TRD shown in FIG. 2 switches on for the fixed time. For that time one end of the ferroelectric capacitor Cr (a side (b) in FIG. 2) is connected with the grounding line Vss, thereby getting into the low state "L". Then the line GC which is being connected with the other end of the ferroelectric capacitor Cr (a side (a) in FIG. 2) is in the low state "L" (see FIG. 6(z)).

That is, as shown in FIG. 5, the ferroelectric capacitor is forced into a polarity state P11.

Next, the reference-cell driving circuit 12 gets the plate line PL1 and the line GCP into the high state "H" (see FIG. 6(f) and (g)), thereby applying a high potential "H" (which corresponds to a read-out voltage Vp or a voltage Vr for generating a threshold voltage) to both the other end of the ferroelectric capacitor C11 and the other end (the side (a)) of the ferroelectric capacitor Cr.

Next, the word line is put into a high state "H" (see FIG. 6(h)), thereby switching the selector transistor TR11 on. On switching the selector transistor TR11 on, the ferroelectric capacitor C11 gets electrically connected with the capacitor Cb in series.

As a result of that, the read-out voltage Vp is applied to the both ends of a section in which the ferroelectric capacitor C11 and the capacitor Cb for load are connected. At that time a partial pressure V1 occurs in both ends of the ferroelectric capacitor C11 according to the read-out voltage Vp as shown in FIG. 4. According to the graphical solution, the partial pressure V1 is given as a voltage of the ferroelectric capacitor C11 for a point P4. Therefore, the potential of the bit line /BL1 is a value shown in FIG. 6(i) when the ground is used as a reference.

Also, at that time, the capacitor Cb for load changes from a polarity state P20 to a polarity state P4 as shown in FIG. 4.

The reference-cell driving circuit 12 gets the line RWL into the high state "H" (as described above) as it makes the word line WL1 into the high state "H" (see FIG. 6(j)). On getting the line RWL into the high state "H", the transistor TRC is switched on. On switching the transistor TRC on, the ferroelectric capacitor Cr is made to electrically connect with the capacitor Cc for load in series. As a result of that, the voltage Vr for generating the threshold-voltage (which is the same value as the read-out voltage Vp in this embodiment) is applied to both ends of the ferroelectric capacitor Cr and the capacitor Cc for load which are connected.

On the other hand, as described above the capacitor Cr is in a polarity state "P11" shown in FIG. 5. Also, the capacitor Cc for load is in a polarity state "P21". Therefore, when the ferroelectric capacitor Cr is connected with the capacitor Cc a partial pressure (or the reference voltage Vref) occurs at both ends of the ferroelectric capacitor Cr according to the voltage Vr for generating the threshold-voltage voltage. According to the graphical solution in FIG. 5, the ferroelectric capacitor Cr and the capacitor Cc for load are both changed into a polarity state "P12". The reference voltage Vref is given as a potential of the ferroelectric capacitorCr for the polarity statel "P12". Therefore, a potential of the bit line BL1 is given as a value shown in FIG. 6(k) when the ground is used as a reference.

Next, the sense amplifier AMP1 is driven (see FIG. 6(i)) The sense amplifier AMP1 makes a comparison of value between the described-above reference voltage Vref (or the threshold voltage) which is given from the reference-cell preset circuit portion 16 via the bit line BL1 and the described-above partial pressure V1 of the ferroelectric capacitor C11, in fact making a comparison of value between the potential of the reference voltage Vref and the potential of the partial pressure V1 when the read-out voltage Vp shown in FIG. 4 is used as a reference. When the partial pressure V1 is more than the read-out voltage Vp, the sense amplifier AMP1 judges that data is "H" and gets the bit line BL1 to be in the low potential "L" (see FIG. 6(n)) as well as getting the bit line /BL1 to be in the high potential "H" (see FIG. 6(m))

At that time, the ferroelectric capacitor C11 is in a polarity state P5 shown in FIG. 4. The capacitor Cb for load is in a polarity state P22. Also, as shown in FIG. 5 the capacitor Cc for load is changed back into a polarity state P21. The ferroelectric capacitor Cr is in a polarity state P13 shown in FIG. 5.

Next, an output from the reference-cell driving circuit 12 (see FIG. 1) gets the line RWL into the low state "L" (see FIG. 6(o)). On getting the line RWL into the low state "L" the ferroelectric capacitor Cr goes into a floating state. As a result of that, the ferroelectric capacitor Cr goes near a polarity state P11 shown in FIG. 5 with sponteineous discharge as when time passes.

Next, an output from the reference-cell driving circuit 12 (see FIG. 1) gets both the plate line PL1 and the line GCP into the low state "L" (see FIG. 6(p) and (q)).

On getting the plate line PL1 into the low state "L", a potential difference occurs between the plate line PL1 and the bit line /BL1 which is then in the potential "H". This potential difference, which is the first rewrite voltage Vrw1 shown in FIG. 4, is applied to both ends of the ferroelectric capacitor C11. On applying the first rewrite voltage Vrw1 thereto the ferroelectric capacitor C11 goes into a polarity state P6 shown in FIG. 4. This state is a state of full charge.

There is no change the polarity state of the ferroelectric capacitor Cr when the line GCP is put into the low state "L" because the ferroelectric capacitor Cr is in the floating state as described above. Also, at that time the capacitors for load Cb and Cc do not change their respective polarity states yet.

Next, the word line WL1 is put down into the low state "L" (see FIG. 6(r)) with the ferroelectric capacitor C11 being fully charged, thereby turning the selector transistor TR11 off and getting the ferroelectric capacitor C11 into the floating state. As a result of that, the ferroelectric capacitor C11 changes from a polarity state P6 and goes near a polarity state P1 with spontaneous discharge when time passes.

Next, an outputline B1 (see FIG. 1) of the column decoder 22 goes high (see FIG. 6 (s)), thereby taking the high potential "H" (see FIG. 6(t)) from the bit line /BL1 into the output buffer 24. After that, the sense amplifierAMP1 is turned off (see FIG. 6(u)), thereby getting the bit lines /BL1 and BL1 into the floating state again (see FIG. 6(v) and (w)). Finally, the read-out operation is ended by changing back the output line B1 of the column decoder 22 into the low state "L".

On getting the bit lines /BL1 and BL1 into the floating state, the capacitor Cb for load changes from a polarity state P22 shown in FIG. 4 and goes to a polarity state P20 with spontaneous discharge when time passes. Also, as shown in FIG. 5 the capacitor Cc for load remains in the polarity state "P21".

As is described, when the data "H" is read out, the capacitor Cb for load changes from a polarity state "P20" to a polarity state "P20" through polarity states P4 and P22 as shown in FIG. 4 in a series of read-out operations. The capacitor Cc for load changes from a polarity state P21 to a polarity state P21 through a polarity state P12 as shown in FIG. 5. Also, the ferroelectric capacitor Cr changes from a polarity state P11 to a polarity state P11 through polarity states P12 and P13 as shown in FIG. 5.

Besides, the ferroelectric capacitor C11 changes from a polarity state P1 to a polarity state P1 through the polarity states P4, P5 and P6 as shown in FIG. 4.

Figure 7:
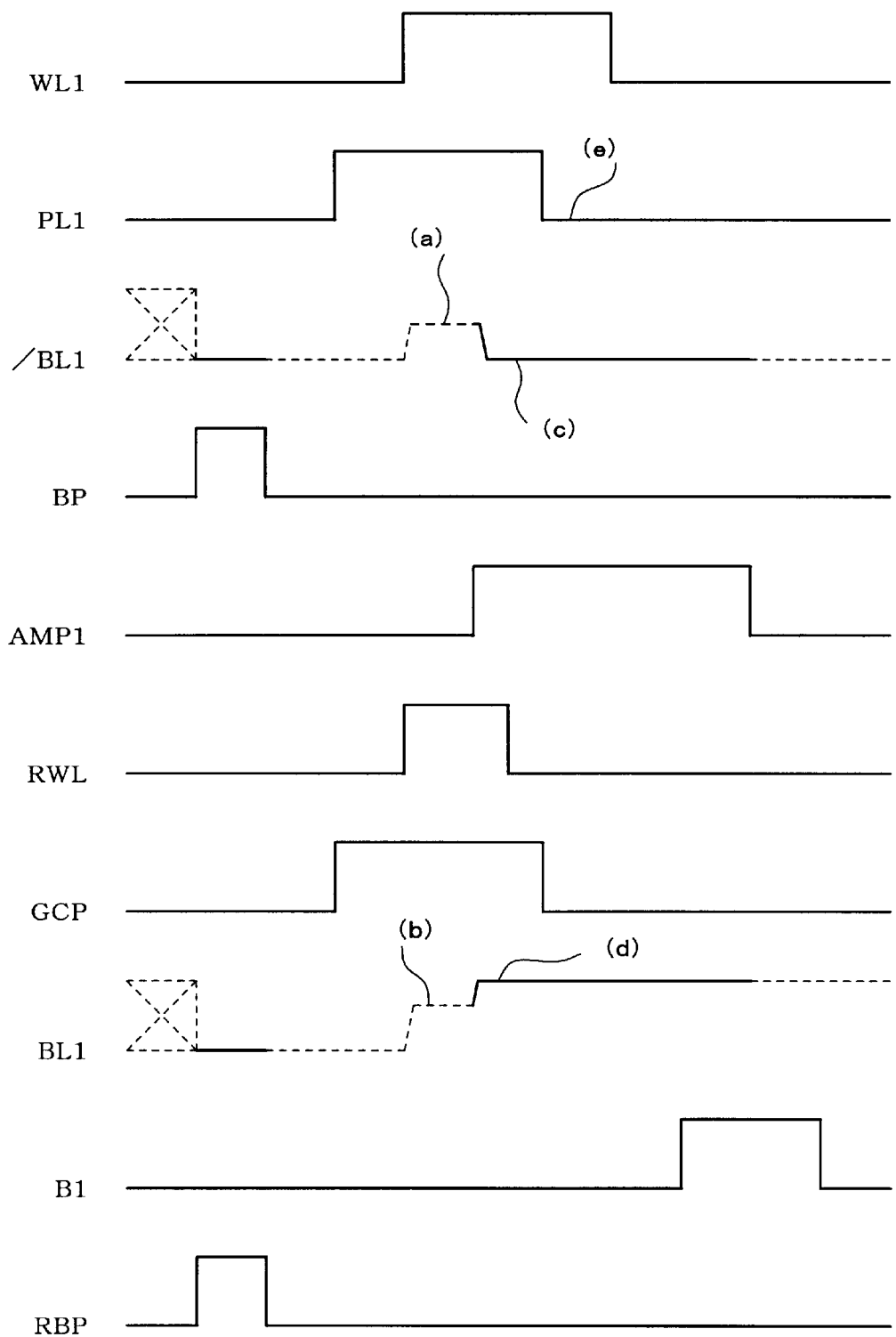
FIG. 7 is a timing chart which is used to explain operations for reading out data "L" in the ferroelectric memory 10.

Next, there will be described operations when data "L" is read out. FIG. 7 shows state of each signal line or the like when the data "L" is read out in a timing chart. As shown in FIG. 6 and FIG. 7, the ferroelectric memory 10 according to this embodiment is designed to read out data in the same processing procedures in spite of the kind ("H" or "L") of data.

Operations for reading out the data "L" is performed as the operations for reading out the data "H". As shown in FIG. 4, however, the case where the data "H" is read out is different from the case where the data "L" is read out in that the ferroelectric capacitor C11 is in the second polarity state "P2" before the data "L" is read out.

In the case where the data "L" is read out, when the read-out voltage Vp is applied thereto, the ferroelectric capacitor C11 is in a polarity state "P3". Therefore, a partial pressure which occurs between both ends of the ferroelectric capacitor is the value of "V2". At that time, the potential of the bit line BL1 is a value shown in FIG. 7(a) when the ground is used as a reference.

By the way, the potential of the bit line BL1 has the same reference voltage Vref as the case of the data "H" but the reference voltage Vref is designed to be more than the partial pressure "P2". Therefore, the sense amplifier AMP1 judges that data is "L" and gets the bit line BL1 into the high potential "H" (see FIG. 7(d)) as well as getting the bit line /BL1 into the low potential "L" (see FIG. 7(c)).

As a result of that, the capacitor Cb for load changes from a polarity state "P30" (which corresponds to the polarity state P20) to a polarity state "P3" and then changes back to the polarity state "P30". Also, as shown in FIG. 5 the capacitor Cc for load changes from a polarity state "P21" to a polarity state "P23" through a polarity state "P12". After that, the polarity state of the capacitor Cc for load, on getting the bit line BL1 into the floating state (see FIG. 7), goes near the polarity state P21 with spontaneous discharge.

By the way, on getting the bit line /BL1 into the low potential "L", a difference potential occurs between the bit line /BL1 and the plate line PL1 which is then in the potential "H". This difference potential, which corresponds to the second rewrite voltage Vrw2 shown in FIG. 4 (which is equal with the read-out voltage Vp), is applied to both ends of the ferroelectric capacitor C11. On applying the second rewrite voltage Vrw2 thereto, the ferroelectric capacitor C11 changes to a polarity state "P7".

While, there occurs no difference potential between the bit line BL1 and the line GCP which is then in the potential "H" when the bit line BL1 is put into the high potential "H". That is, voltage which is applied to both ends of the ferroelectric capacitor Cr goes to 0 volt. As a result of that, the ferroelectric capacitor Cr is forced to change from a polarity state P11 to a polarity state P12 and then change back to the polarity state P11.

After that, the plate line PL1 is put into the low state "L (see FIG. 7(e))", thereby forcing voltage which is applied to both ends of the ferroelectric capacitor C11 to be 0 volt. As a result of that, the ferroelectric capacitor C11 changes back to the second polarity state P2 of FIG. 4.

Therefore, in the case where the data "L" is read out, the capacitor Cb for load changes from a polarity state P30 to a polarity state P3 and changes back to the polarity state P30 in a series of read-out operations as shown in FIG. 4. The capacitor Cc for load changes from a polarity state P21 to a polarity state P23 through a polarity state P12 and then changes back to the polarity state P21 as shown in FIG. 5. Also, the ferroelectric capacitor Cr changes from a polarity state P11 to a polarity state P12 and then changes back to the polarity state P11 as shown in FIG. 5.

Further, the ferroelectric capacitor C11 changes from a polarity state P2 to a polarity state P7 through a polarity state P3 and then change backs to the polarity state P2.

As described above, in the series of read-out operations, the change in the polarity state of the capacitor Cb for load is from the polarity state P20 (or P30) to the polarity state P22 in spite of the kinds ("H" or "L") of data as shown in FIG. 4. For the floating state, the capacitor Cb is in the polarity state P20. Similarly, the change in the polarity state of the capacitor Cc for load is from the polarity state P21 to the polarity state P23 as shown in FIG. 5. For the floating state, the capacitor Cc is in the polarity state P21.

That is, one end of the capacitor Cb for load is connected to the ground and the other end is connected to the bit line /BL1. While, as shown in FIG. 6 and FIG. 7, in each of the described-above operations the potential of the bit line /BL1 is only switched between the potential "H" (which corresponds to the first rewrite voltage Vrwl) and the potential "L" (which corresponds to the potential of ground). Therefore, voltage which is applied thereto is always of the same direction of polarity, and its value ranges from 0 volt to a value of the voltage Vrwl. Therefore, the capacitor Cb for load does not change in the direction of polarity for each of the above-described operations that is applied to the capacitor Cc for load.

Also, as described above, the change in the polarity state of the ferroelectric capacitor Cr is from the polarity state P11 to the polarity state P13 in spite of the kinds ("H" or "L") of data as-shown in FIG. 5. For the floating state, the capacitor Cr is in the polarity state P11. That is, the ferroelectric capacitor Cr also does not change in the direction of polarity for each of the above-described operations.

Figure 8:
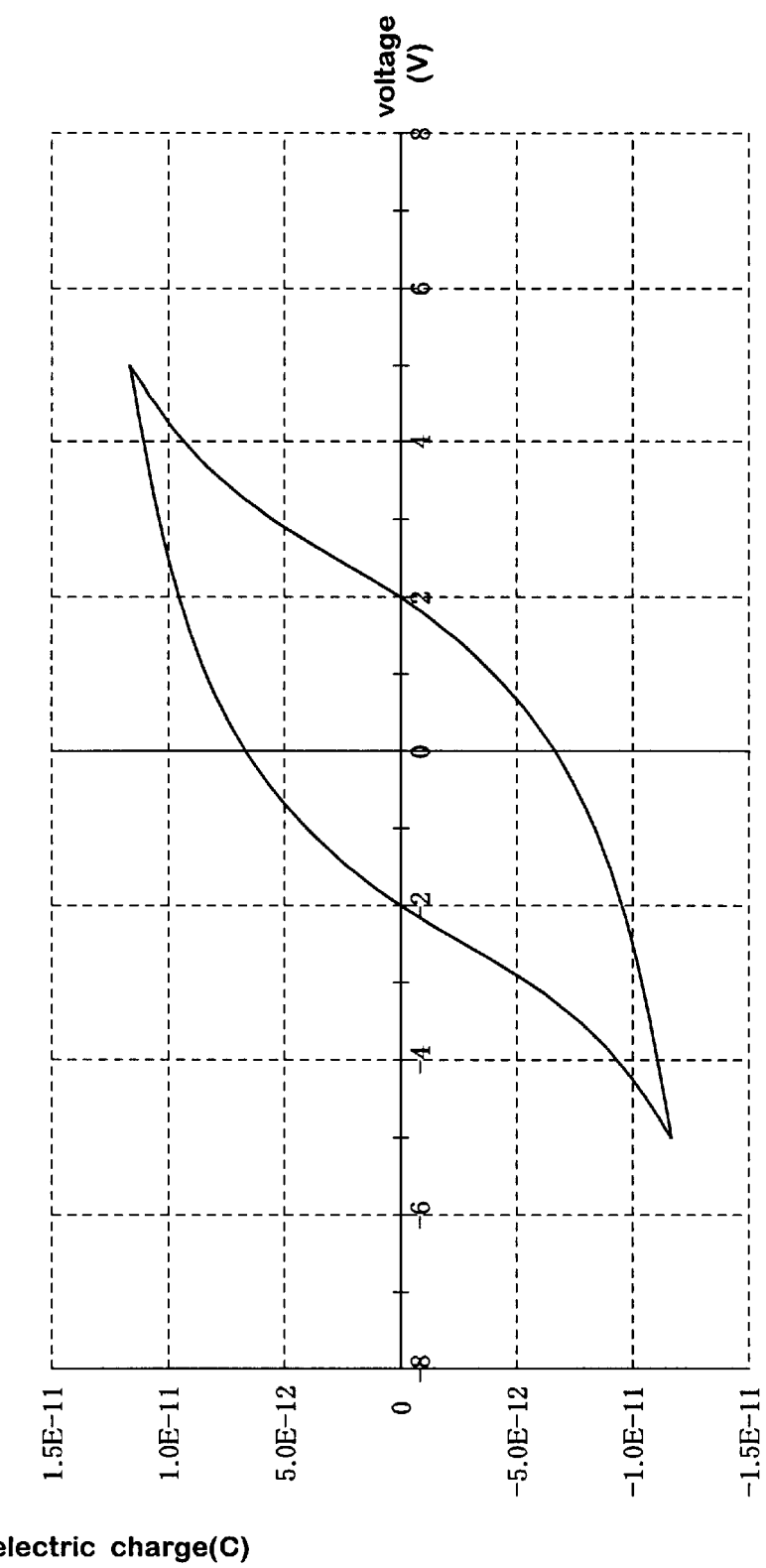
FIG. 8 is a graph showing a hysteresis curve of the capacitor Cb or Cc or the ferroelectric capacitor Cr which has a normal electric property
Figure 9:
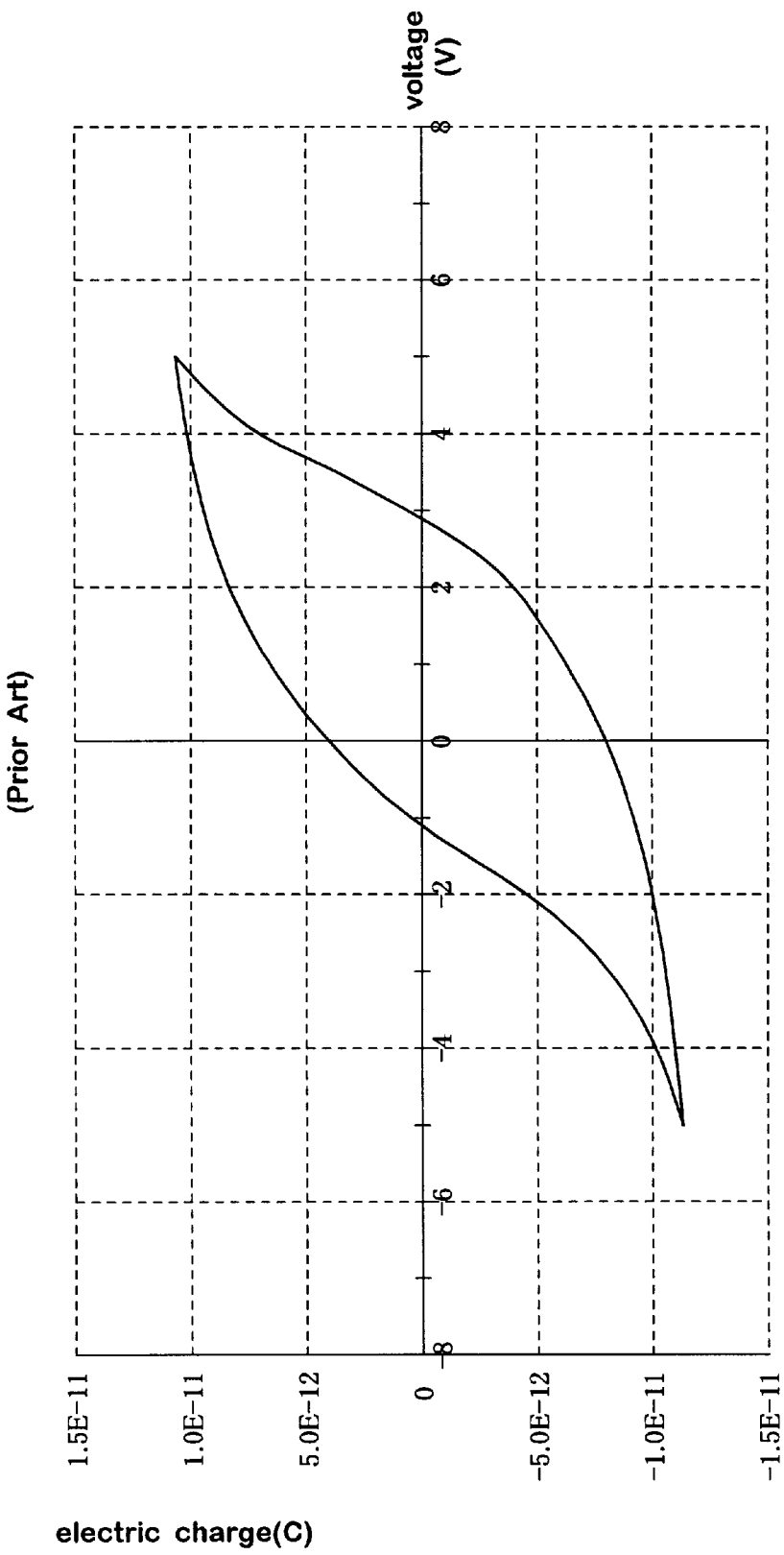
FIG. 9 is a graph showing a hysteresis curve of the capacitor Cb or Cc or the ferroelectric capacitor Cr which has a bad electric property.
Figure 10:
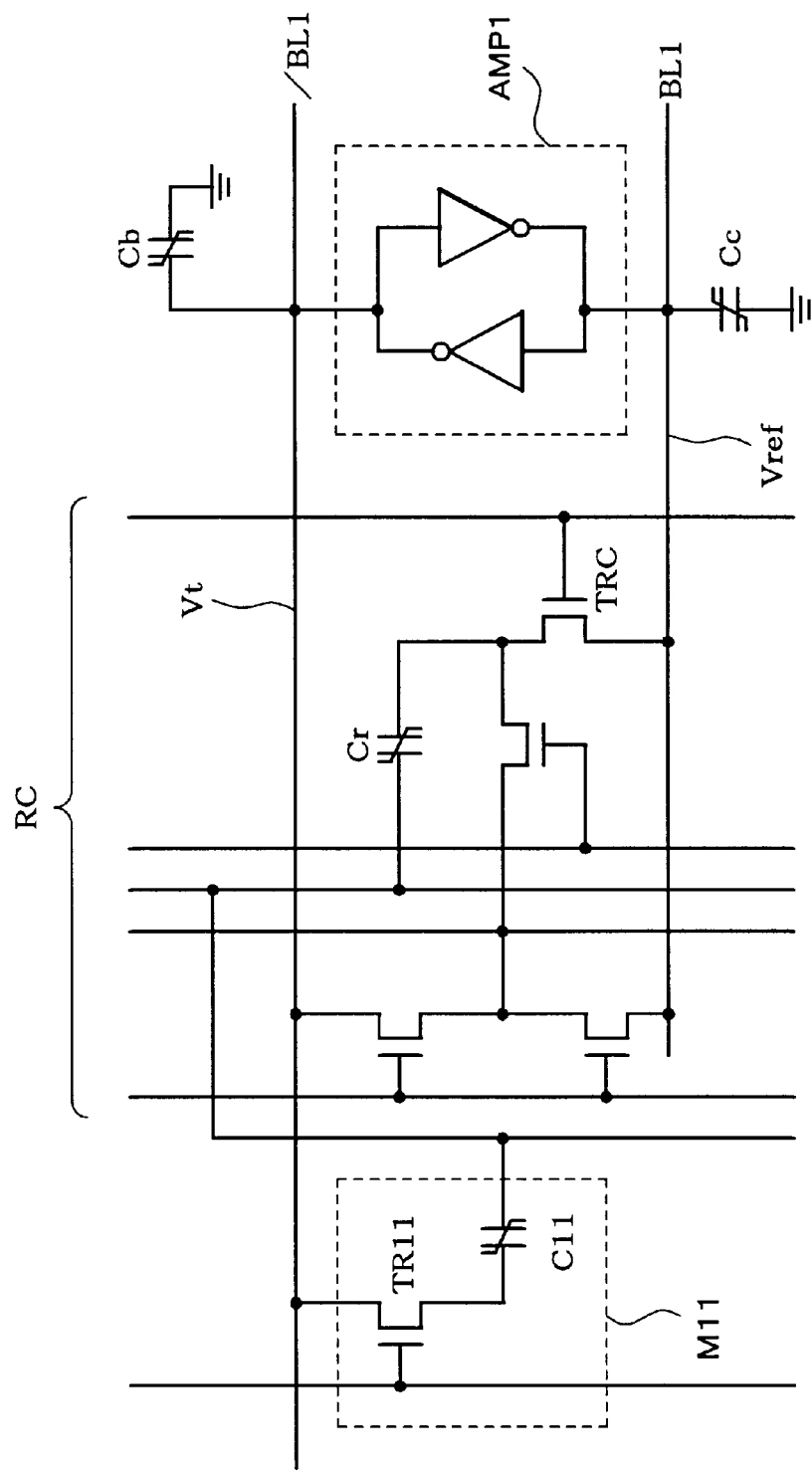
FIG. 10 is a circuit diagram showing a part of a conventional ferroelectric memory

Therefore, when the direction of these capacitors in their respective bridge circuit is not changed, their respective hysteresis curve changes from what is first shown in FIG. 8 to distorted that which is shown in FIG. 9 because these capacitors are getting the bad electric property ("imprint effect") as time passes.

In this embodiment, the switch-signal generating circuit 102 shown in FIG. 2 counts the leading edges of the line GCP, and switches the level of the switch signal which is applied to the line SWS on counting a predetermined number (see FIG. 3B). That is, the directions of the capacitors Cb and Cc for load and the ferroelectric capacitor Cr in their respective bridge circuit are changed whenever the number of readout operations reaches a determined number.

Such a design prevents these capacitors from getting a bad electrical property, thereby keeping the hysteresis curve in the state of FIG. 8.

Meanwhile, though in this embodiment, the direction of the ferroelectric capacitor in its bridge circuit is designed to be changed when the number of leading edges of the line GCP reaches a predetermined number, the direction may be changed at every leading edge of the line GCP. Also, to change the direction of the ferroelectric capacitor in its bridge circuit may depend on not only the leading edges of the line GCP but also on a drop in the output line B1 shown in FIG. 6 or power-on operation. Also, the change in the direction of the ferroelectric capacitor may be performed using a selected timer. Further, that change may be performed by an external program.

The change in the direction of the ferroelectric capacitor may be designed to be manually performed if required.

Also, though, in the described-above embodiment, a bridge circuit is made using the ferroelectric capacitor and the four transistors in order to change the direction of the ferroelectric capacitor in the bridge circuit, means for changing the direction of the ferroelectric capacitor is not what depends on this.

Also, though, in the described-above embodiment, for three types of ferroelectric capacitors of the ferroelectric memory 10 (specifically the capacitors Cb and Cc for load and the ferroelectric capacitor Cr), all their directions in their respective bridge circuits are designed to be changed, the design may be applied only to one or two types of these ferroelectric capacitors.

Also, this invention may be applied to not only such a ferroelectric memory that ferroelectric capacitors are used for all the described-above three types of capacitor but also such a ferroelectric memory that ferroelectric capacitors, are used for one or two types of the three types of capacitor.

Also, though, in the described-above embodiment, the ferroelectric memory is used as an example of semiconductor device, this invention may be applied to not only the ferroelectric memory but also semiconductor devices which are characterized in that plural capacitors including at least one ferroelectric capacitor are to be electrically connected in series.

This invention, further, may be applied to not only the semiconductor devices which are characterized in that plural capacitors including at least one ferroelectric capacitor are to be electrically connected in series but also to all semiconductor devices comprising a pair of sections to which their respective voltages are applied, the polarity between the pair of sections being not shifted, and, a ferroelectric capacitor which is electrically connected with the pair of sections.

A semiconductor device according to this invention is characterized in that the semiconductor device is designed to be able to substantially change the direction in which the ferroelectric capacitor is connected with the pair of sections.

Therefore, the polarity of voltage which is applied to the ferroelectric capacitor can be changed over if required in spite of that the polarity of voltage which is applied to the pair of sections is not shifted. That fact can prevent the ferroelectric capacitor from polarizing in the same direction for long times. That is, the ferroelectric capacitors are difficult to get a bad electric property.

A semiconductor device according to this invention is characterized in that plural capacitors including a ferroelectric capacitor is to be connected in series and the direction in which the ferroelectric capacitor is connected with the capacitor(s) except the ferroelectric capacitor is to be substantially changed.

Therefore, that can prevent the ferroelectric capacitor from getting a bad electric property in a circuit wherein when a predetermined voltage is applied to the plural capacitors including the ferroelectric capacitor which are connected in series, a partial pressure occurring in a specific capacitor is used for a desired operation.

A semiconductor device according to this invention is characterized in that when a predetermined voltage is applied to a capacitor for memory storage and a ferroelectric capacitor for load which are connected in series, data is read out using a voltage occurring between the both ends of the ferroelectric capacitor for load and that the direction in which the ferroelectric capacitor for load is connected with the capacitor for memory storage is to be substantially changed.

Therefore, to change the direction in which the ferroelectric capacitor for load is connected with the capacitor for memory storage if required can prevent the ferroelectric capacitor for load from getting a bad electric property. Therefore, that can prevent the voltage occurring at the both ends of the ferroelectric capacitor for load from changing as time passes. That means the reliability of read-out operations can be kept for a long time when this invention is applied to memories.

A semiconductor device according to this invention is characterized in that when a predetermined voltage is applied to a reference ferroelectric capacitor and a capacitor for load which are connected in series, a predetermined reference voltage is obtained using voltage occurring between both ends of the reference ferroelectric capacitor and that the direction in which the reference ferroelectric capacitor is connected with the capacitor for load is to be substantially changed.

Therefore, to change the direction in which the reference ferroelectric capacitor is connected with the capacitor for load, if required, can prevent the reference ferroelectric capacitor from getting a bad electric property. Therefore, that can prevent the voltage occurring at the both ends of the reference ferroelectric capacitor from changing as time passes. That means the predetermined reference voltage can be kept for a long time when this invention is applied to memories.

A semiconductor device according to this invention is characterized in that when a predetermined voltage is applied to a reference capacitor and a ferroelectric capacitor for load which are connected in series, a predetermined reference voltage is obtained using a voltage occurring between the both ends of the ferroelectric capacitor for load and that the direction in which the ferroelectric capacitor for load is connected with the reference capacitor is to be substantially changed.

Therefore, to change the direction in which the ferroelectric capacitor for load is connected with the reference capacitor if required can prevent the ferroelectric capacitor for load from getting a bad electric property. Therefore, that can prevent the voltage occurring at the both ends of the ferroelectric capacitor for load from changing as time passes. That means the predetermined reference voltage can be kept for a long time when this invention is applied to memories.

A semiconductor device according to this invention is characterized in that changing the direction of a ferroelectric capacitor in its circuit is automatically performed at a predetermined timing. That can prevent the ferroelectric capacitor from getting a bad electric property without other operations.

Having described preferred embodiments of the invention, it is to be understood that the used terms may be changed without departing form the scope or spirit of the invention as defined in the appended claims because they are used not limiting but for explaining.

What is claimed is:

1. A semiconductor device comprising:
   first and second sections to which first and second voltages can be applied to establish a polarity;
   a ferroelectric capacitor having first and second ends, said ferroelectric capacitor being electrically connected with said first and second sections in a first direction when said first end of said ferroelectric capacitor is in electrical communication with said first voltage rather than said second voltage and in a second direction when said second end of said ferroelectric capacitor is in electrical communication with said second voltage rather than said first voltage; and
   mechanism which can change said ferroelectric capacitor being electrically connected with said first and second sections between said first and second directions without a change in said polarity.

2. A semiconductor device in accordance with claim 1, wherein the change between the first and second directions in which said ferroelectric capacitor is connected with said first and second sections is automatically performed in predetermined timing.

3. A semiconductor device in accordance with claim 1, further comprising at least one other capacitor,
   wherein said ferroelectric capacitor and said at least one other capacitor are able to be electrically connected in series, and,
   said mechanisms also being able to substantially change said ferroelectric capacitor being electrically connected with said at least one other capacitor between said first and second directions.

4. A semiconductor device in accordance with claim 3, wherein the change between said first and second directions in which said ferroelectric capacitor is connected with said at least one capacitor is automatically performed in predetermined timing.

5. A semiconductor device in accordance with claim 3, wherein a capacitor for memory storage which is used as said at least one other capacitor is capable of holding said polarity according to kind of data,
   wherein said capacitor for memory storage and a ferroelectric capacitor for load which is used as said ferroelectric capacitor are electrically connected in series,
   including mechanism to read out data using a voltage generated between the ends of said ferroelectric capacitor for load when a predetermined voltage is applied to said capacitor for memory storage and said ferroelectric capacitor for load which are electrically connected in series, and,
   including mechanism to be able to substantially change between the first and second directions in which said ferroelectric capacitor for load is connected with said capacitor for memory storage.

6. A semiconductor device in accordance with claim 5, wherein the change between said first and second directions in which said ferroelectric capacitor for load is connected with said capacitor for memory storage is automatically performed in predetermined timing.

7. A semiconductor device in accordance with claim 3, wherein a reference ferroelectric capacitor is used as said ferroelectric capacitor,
   a capacitor for load which is used as said at least one other capacitor is electrically connected in series with said reference ferroelectric capacitor,
   mechanism to obtain a predetermined reference voltage using a voltage generated between the ends of said reference ferroelectric capacitor when a predetermined voltage is applied to said reference ferroelectric capacitor and said capacitor for load which are electrically connected in series, and, mechanism to be able to substantially change between the first and second directions in which said reference ferroelectric capacitor is connected with said capacitor for load.

8. A semiconductor device in accordance with claim 7, wherein the change between said first and second directions in which said reference ferroelectric capacitor is connected with said capacitor for load is automatically performed in predetermined timing.

9. A semiconductor device in accordance with claim 3, wherein a reference capacitor is used as said at least one other capacitor, a ferroelectric capacitor for load which is used as said ferroelectric capacitor is electrically connected in series with said reference capacitor, mechanism to obtain a predetermined reference voltage using a voltage generated between the ends of said ferreoelectric capacitor for load when a predetermined voltage is applied to said reference capacitor and said ferroelectric capacitor for load which are electrically connected in series, and, mechanism to be able to substantially change between the first and second directions in which said ferroelectric capacitor for load is connected with said reference capacitor.

10. A semiconductor device in accordance with claim 9, wherein the change between said first and second directions in which said ferroelectric capacitor for load is connected with said reference capacitor is automatically performed in predetermined timing.

11. A semiconductor device in accordance with claim 1, further comprising four transistors wherein a bridge circuit is made including said first and second sections, said ferroelectric capacitor and said four transistors, wherein each of said four transistors is placed at one of the four sides of the bridge circuit, said ferroelectric capacitor is connected between a pair of opposite vertices of the bridge circuit, and one of said first and second sections is connected with one of the other pair of opposite vertices and the other of said pair of sections is connected with the other of the other pair of opposite vertices, and, wherein the semiconductor device is characterized in that one pair of opposite transistors is on when the other pair of opposite transistors is off or the former pair of opposite transistors is off when the latter pair of opposite transistors is on and that by switching state of said four transistors in this way substantially changes between said first and second directions in which said ferroelectric capacitor is connected with said first and second sections.

12. A semiconductor device in accordance with claim 11, further comprising a switch-signal generating circuit which is used to switch state of said four transistors of the bridge circuit for every predetermined number of accesses to said semiconductor device, wherein the change between said first and second directions in which said ferroelectric capacitor is connected with said first and second sections is able to be automatically performed for every said predetermined number of accesses to said semiconductor device.

13. A semiconductor device in accordance with claim 11, further comprising at least one other capacitor, wherein said ferroelectric capacitor and said at least one other capacitor are able to be electrically connected in series, and, including mechanism to be able to substantially change between said first and second directions in which said ferroelectric capacitor is connected with said at least one other capacitor.

14. A semiconductor device in accordance with claim 13, further comprising a switch-signal generating circuit which is used to switch state of said four transistors of the bridge circuit for every predetermined number of accesses to said semiconductor device, wherein the change between said first and second directions in which said ferroelectric capacitor is connected with said at least one other capacitor is able to be automatically performed for every said predetermined number of accesses to said semiconductor device.

15. A semiconductor device in accordance with claim 13, wherein a capacitor for memory storage which is used as at least one other capacitor is capable of holding said polarity according to kind of data, wherein said capacitor for memory storage and a ferroelectric capacitor for load which is used as said ferroelectric capacitor are electrically connected in series, including mechanism to read out data using a voltage generated between the ends of said ferroelectric capacitor for load when a predetermined voltage is applied to said capacitor for memory storage and said ferroelectric capacitor for load which electrically connected in series, and, including mechanism to be able to substantially change between said first and second directions in which said ferroelectric capacitor for load is connected with said capacitor for memory storage.

16. A semiconductor device in accordance with claim 15, further comprising a switch-signal generating circuit which is used to switch state of said four transistors of the bridge circuit for every predetermined number of accesses to said semiconductor device, wherein the change between said first and second directions in which said ferroelectric capacitor for load is connected with said capacitor for memory storage is able to be automatically performed for every predetermined number of accesses to said semiconductor device.

17. A semiconductor device in accordance with claim 13, wherein a reference ferroelectric capacitor is used as said ferroelectric capacitor, a capacitor for load which is used as said at least one other capacitor is electrically connected in series with said reference ferroelectric capacitor, mechanism to obtain a predetermined reference voltage using a voltage generated between the ends of said reference ferroelectric capacitor when a predetermined voltage is applied to said reference ferroelectric capacitor and said capacitor for load which are electrically connected in series, and, mechanism to be able to substantially change between said first and second directions in which said reference ferroelectric capacitor is connected with said capacitor for load.

18. A semiconductor device in accordance with claim 17, further comprising a switch-signal generating circuit which is used to switch state of said four transistors of the bridge circuit for every predetermined number of accesses to said semiconductor device, wherein the change between said first and second directions in which said reference ferroelectric capacitor is connected with said capacitor for load is able to be automatically performed for every said predetermined number of accesses to said semiconductor device.

19. A semiconductor device in accordance with claim 13, wherein a reference capacitor is used as said at least one other capacitor, a ferroelectric capacitor for load which is used as said ferroelectric capacitor is electrically connected in series with said reference capacitor, mechanism to obtain a predetermined reference voltage using a voltage generated between the ends of said ferroelectric capacitor for load when a predetermined voltage is applied to said reference capacitor and said ferroelectric capacitor for load which are electrically connected in series, and, mechanism to be able to substantially change between said first and second directions in which said ferroelectric capacitor for load is connected with said reference capacitor.

20. A semiconductor device in accordance with claim 19, further comprising a switch-signal generating circuit which is used to switch state of said four transistors of the bridge circuit for every predetermined number of accesses to said semiconductor device, wherein the change between said first and second directions in which said ferroelectric capacitor for load is connected with said reference capacitor is able to be automatically performed for every said predetermined number of accesses to said semiconductor device.

* * * * *